United States Patent
Engel et al.

(10) Patent No.: US 11,598,829 B2
(45) Date of Patent: Mar. 7, 2023

(54) METHOD AND SYSTEM FOR MAGNETIZING ELEMENTS OF A MAGNETIC FIELD SENSOR ARRAY

(71) Applicant: Robert Bosch GmbH, Stuttgart (DE)

(72) Inventors: Brad Engel, Chandler, AZ (US); Carlo Alberto Romani, Cornaredo (IT); Guido De Sandre, Brugherio (IT); Johannes Artzner, Eningen (DE); Phillip Mather, Phoenix, AZ (US); Martin Maschmann, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/305,594

(22) Filed: Jul. 9, 2021

(65) Prior Publication Data

US 2022/0026508 A1     Jan. 27, 2022

(30) Foreign Application Priority Data

Jul. 23, 2020   (DE) ..................... 10 2020 209 324.5

(51) Int. Cl.
*G01R 33/09*     (2006.01)
*G01R 33/00*     (2006.01)

(52) U.S. Cl.
CPC ....... *G01R 33/098* (2013.01); *G01R 33/0029* (2013.01); *G01R 33/093* (2013.01)

(58) Field of Classification Search
CPC .............. G01R 33/098; G01R 33/0029; G01R 33/093; G01R 33/0017; G01R 33/0094
See application file for complete search history.

(56) References Cited

U.S. PATENT DOCUMENTS 8,781,523 B2   7/2014 Zilka
9,291,687 B2   3/2016 Engel et al.
(Continued)

*Primary Examiner* — Feba Pothen
(74) *Attorney, Agent, or Firm* — Norton Rose Fulbright US LLP; Gerard Messina

(57) ABSTRACT

A magnetic field sensor array includes a plurality of sensor segments, each including a plurality of magnetic field sensors. A magnetizing current conductor is situated so as to run in the area of the magnetic field sensors in such a way that elements of the magnetic field sensors may be magnetized. A plurality of parallel-connected half-bridges, each including a high switch $p_J$ and a low switch $n_J$, each include a center tap connection situated between the switches. The magnetizing current conductor is connected to each center tap connection, by means of which the magnetizing current conductor is divided into separately activatable magnetizing segments. Elements of a sensor segment are magnetized in that two switches $n_J$ and $p_{J+1}$ having different electrical potentials, or alternatively $p_J$ and $n_{J+1}$, of two directly adjacent half-bridges are closed simultaneously. At least one further switch $n_{X<J}$ or $p_{Y>J+1}$ or alternatively $p_{X<J}$ or $n_{Y>J+1}$ is closed.

9 Claims, 8 Drawing Sheets

(56) References Cited

U.S. PATENT DOCUMENTS

| | | |
|---|---|---|
| 9,766,301 B2 | 9/2017 | Liu et al. |
| 10,281,531 B2 * | 5/2019 | Engel .................... G01R 33/09 |
| 2015/0331065 A1 * | 11/2015 | Engel ................ G01R 33/0029 |
| | | 324/252 |
| 2016/0313413 A1 * | 10/2016 | Mohan ................ G01R 33/098 |
| 2017/0074948 A1 | 3/2017 | Engel et al. |

* cited by examiner

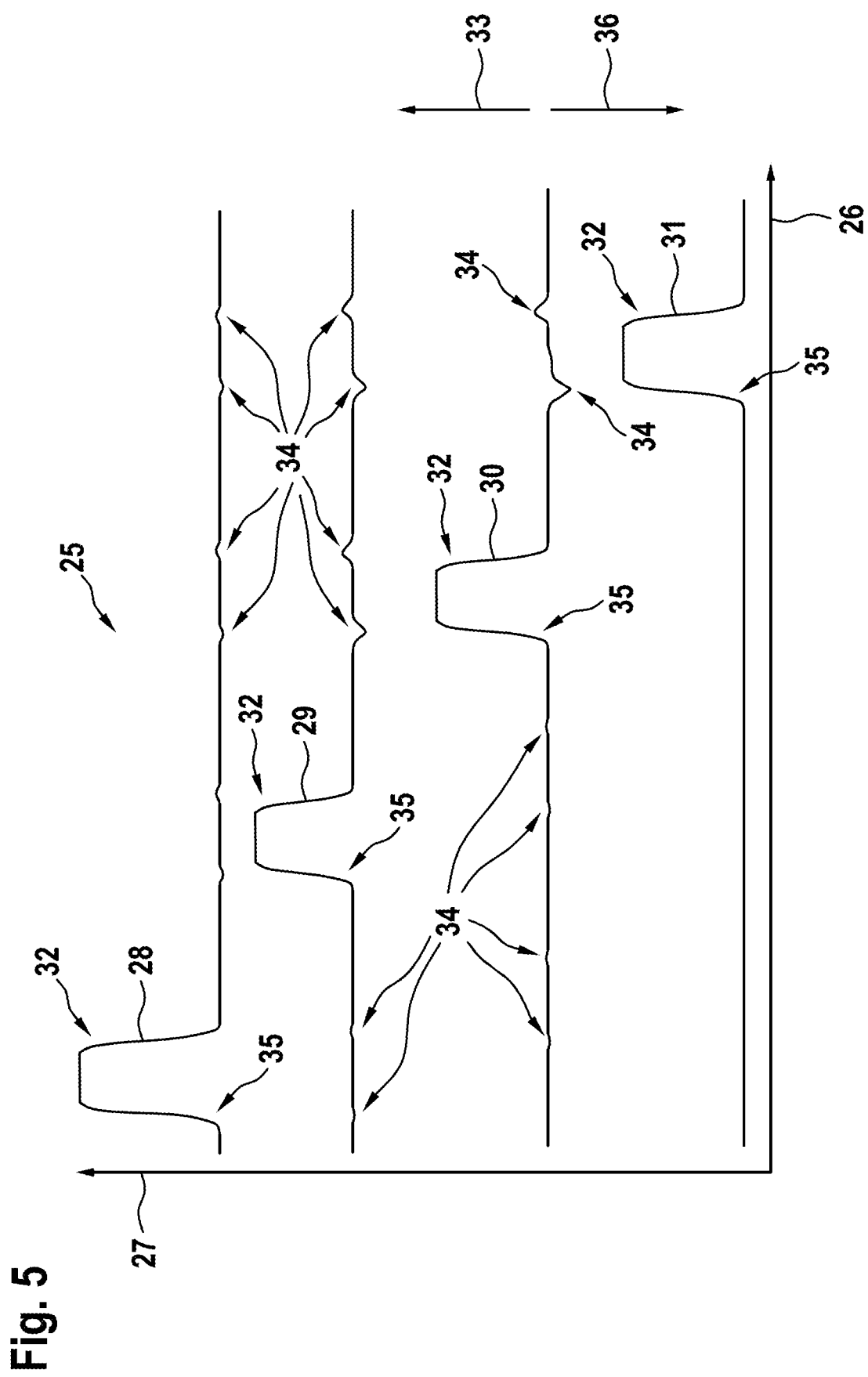

| | $p_7$ | | | | | | $p_1$ |
|---|---|---|---|---|---|---|---|
| 101 | 0<br>0 | 0<br>0 | 0<br>0 | 0<br>0 | 0<br>0 | 0<br>0 | 0<br>1 |
| 102 | 1<br>0 | 1<br>0 | 1<br>0 | 1<br>0 | 1<br>0 | 0<br>0 | 0<br>1 |
| 103 | 1<br>0 | 1<br>0 | 1<br>0 | 1<br>0 | 1<br>0 | 1<br>0 | 0<br>1 |
| 104 | 1<br>0 | 1<br>0 | 1<br>0 | 1<br>0 | 1<br>0 | 0<br>0 | 0<br>1 |
| 105 | 1<br>0 | 1<br>0 | 1<br>0 | 1<br>0 | 1<br>0 | 0<br>1 | 0<br>1 |
| 106 | 1<br>0 | 1<br>0 | 1<br>0 | 1<br>0 | 0<br>0 | 0<br>1 | 0<br>1 |
| 107 | 1<br>0 | 1<br>0 | 1<br>0 | 1<br>0 | 0<br>1 | 0<br>1 | 0<br>1 |
| 108 | 1<br>0 | 1<br>0 | 1<br>0 | 0<br>0 | 0<br>1 | 0<br>1 | 0<br>1 |
| 109 | 1<br>0 | 1<br>0 | 1<br>0 | 0<br>1 | 0<br>1 | 0<br>1 | 0<br>1 |
| 110 | 1<br>0 | 1<br>0 | 0<br>0 | 0<br>1 | 0<br>1 | 0<br>1 | 0<br>1 |
| 111 | 1<br>0 | 1<br>0 | 0<br>1 | 0<br>1 | 0<br>1 | 0<br>1 | 0<br>1 |
| 112 | 1<br>0 | 0<br>0 | 0<br>1 | 0<br>1 | 0<br>1 | 0<br>1 | 0<br>1 |
| 113 | 1<br>0 | 0<br>1 | 0<br>1 | 0<br>1 | 0<br>1 | 0<br>1 | 0<br>1 |
| 114 | 1<br>0 | 0<br>0 | 0<br>1 | 0<br>1 | 0<br>1 | 0<br>1 | 0<br>1 |
| 115 | 0<br>0 | 0<br>0 | 0<br>1 | 0<br>1 | 0<br>1 | 0<br>1 | 0<br>1 |
| | $n_7$ | | ... | | | | $n_1$ |

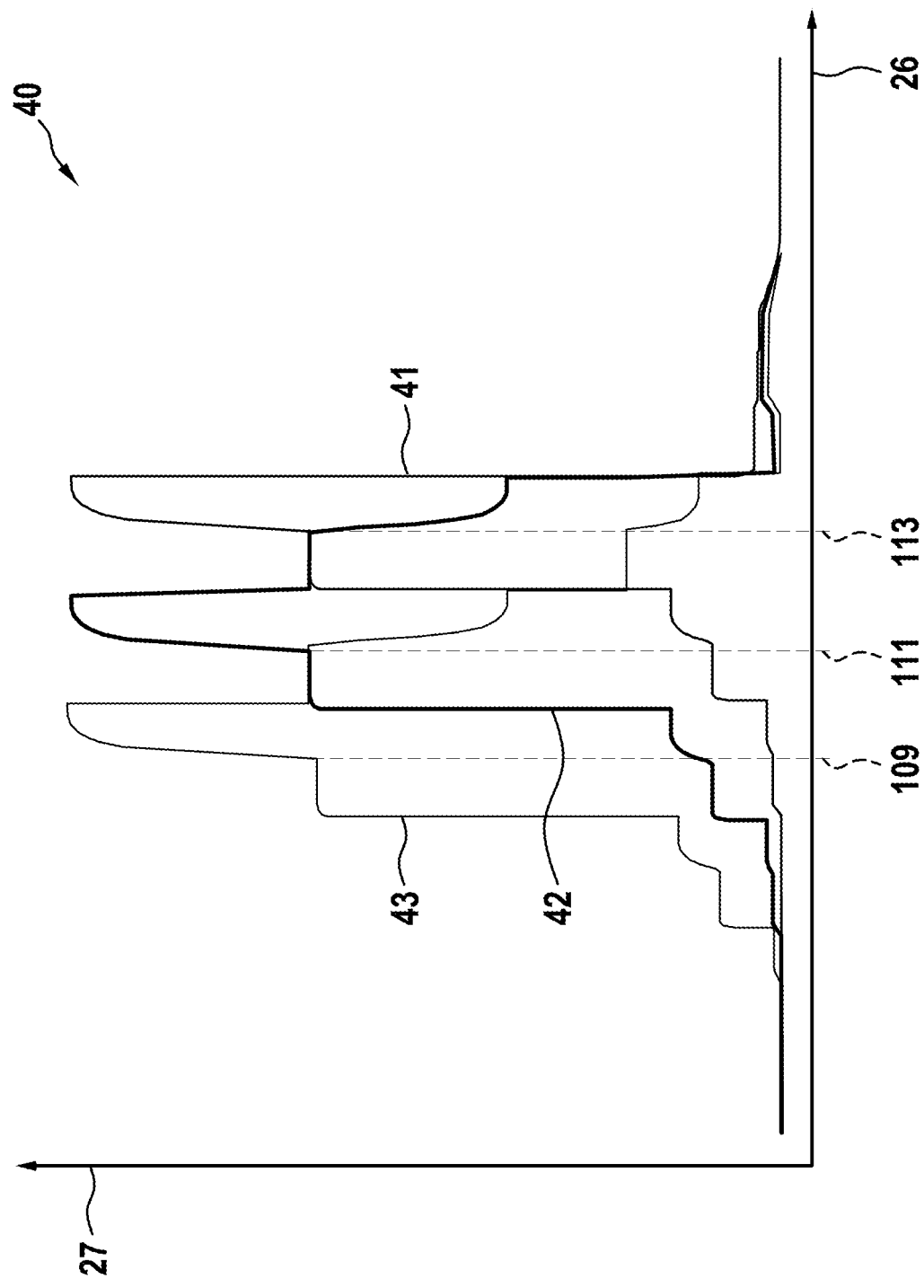

METHOD AND SYSTEM FOR MAGNETIZING ELEMENTS OF A MAGNETIC FIELD SENSOR ARRAY

CROSS REFERENCE

The present application claims the benefit under 35 U.S.C. § 119 of German Patent Application No. DE 102020209324.5 filed on Jul. 23, 2020, which is expressly incorporated herein by reference in its entirety.

FIELD

The present invention relates to a method and a system for magnetizing elements of a magnetic field sensor array with the aid of a magnetizing device.

BACKGROUND INFORMATION

Certain conventional magnetic field sensors are based on magnetoresistive effects. Magnetic field sensors of this type include two magnetized layers situated one above the other and separated from each other by a separating layer. A center magnetization direction of a pinned layer is fixed and invariable in an external magnetic field, while a center magnetization direction of a free layer is dependent on the external magnetic field. By applying an electrical voltage to the two magnetized layers, an electrical current may flow, which is dependent on an angle enclosed by the magnetization directions of the layers.

If an external magnetic field exceeds a critical field strength, the magnetization of the free layer may be impaired. A misorientation of this type may result in the fact that a magnetic field sensor has an elevated noise, which may be the case, in particular, for greater magnetic field strengths. Moreover, an undesirable change of the zero field error (offset) may be present. A misorientation may be reversed, for example, in that a magnetizing current conductor is situated in the area of the layers to be magnetized. Methods of this type are described in U.S. Pat. Nos. 9,291, 687 B2, 9,791,523 B2 and 9,766,301 B2.

A plurality of magnetic field sensors is typically simultaneously subjected to a process of this type. A magnetizing device including a plurality of switches is used to magnetize groups of layers of magnetic field sensors. Upon the switching of the switches, an undesirable current flow may take place in the magnetizing current conductor, which flows in the opposite direction from a desired magnetizing current, due to parasitic capacitances. This may result in layers to be magnetized being at least partially misoriented.

SUMMARY

An object of the present invention is to provide an improved method for magnetizing elements of a magnetic field sensor array as well as to provide an improved system for magnetizing elements of a magnetic field sensor array. This object is achieved by a method for magnetizing elements of a magnetic field sensor array with the aid of a magnetizing device and by a system for magnetizing elements of a magnetic field sensor array in accordance with example embodiments of the present invention. Advantageous refinements of the present invention are disclosed herein.

In accordance with an example embodiment of the present invention, in a method for magnetizing elements of a magnetic field sensor array, these elements are magnetized with the aid of a magnetizing device. The magnetic field sensor array includes a plurality of sensor segments. Each sensor segment includes a plurality of magnetic field sensors. A magnetizing current conductor of the magnetizing device is situated so as to run in the area of the magnetic field sensors in such a way that elements of the magnetic field sensors may be magnetized. The implementation of the magnetizing device includes a plurality of parallel-connected half-bridges, each including a high switch $p_J$ and a low switch $n_J$ and each including a center tap connection situated between switches $p_J$ and $n_J$. The magnetizing current conductor is connected to each center tap connection, by means of which the magnetizing current conductor is divided into separately controllable magnetizing segments. Each magnetizing segment is provided for the purpose of magnetizing elements of magnetizing field sensors of one sensor segment in each case. The method includes the following method steps: An electrical voltage is initially applied to the magnetizing device. The elements of a sensor segment $S_J$ are then magnetized in that two switches $n_J$ and $p_{J+1}$ at different electrical potentials, or alternatively $p_J$ and $n_{J+1}$, of two directly adjacent half-bridges are closed simultaneously, by means of which an electrical current is applied to a corresponding magnetizing segment $M_J$. At least one further switch $n_{X<J}$ or $p_{Y>J+1}$ or alternatively $p_{X<J}$ or $n_{Y>J+1}$ is closed.

The closing of the at least one further switch advantageously effectuates that, due to parasitic capacitances, a current flow in the undesirable direction is prevented at least in a further magnetizing segment $M_{X\ne J}$ of the magnetizing current conductor. As a result, the at least one sensor segment $S_{X\ne J}$ is protected to the extent that elements to be magnetized of the magnetic field sensors of the at least one sensor segment $S_{X\ne J}$ are not exposed to a magnetic field which runs along an undesirable direction. As a result, elements of the magnetic field sensors to be magnetized are not misoriented. A noise of the magnetic field sensors may be advantageously reduced thereby. In particular, the noise behavior may be improved for great magnetic field strengths. Moreover, the method makes it possible that the magnetic field sensors do not have an undesirable change of the zero field error. An undesirable change of a gain, the gain being a quotient of a change of an output signal and a change of an external magnetic field to be measured, may also be prevented thereby.

In one specific embodiment of the present invention, all further switches $n_{X<J}$ and $p_{Y>J+1}$ or alternatively $p_{X<J}$ and $n_{Y>J+1}$ are simultaneously closed while elements of sensor segment $S_J$ are being magnetized. The closing of all further switches $n_{X<J}$ and $P_{Y>J+1}$ or alternatively $p_{X<J}$ and $n_{Y>J+1}$ advantageously effectuates that, due to parasitic capacitances, a current flow in an undesirable direction is prevented in all further magnetizing segments $M_{X\ne J}$ of the magnetizing current conductor.

In one specific embodiment of the present invention, elements of consecutive sensor segments are magnetized sequentially along the magnetizing current conductor, starting with a sensor segment situated at an outermost end of the magnetizing current conductor. A switching complexity during the method may be advantageously reduced thereby, since a number of switching operations is reduced in each magnetization step.

In one specific embodiment of the present invention, switch $p_{J+1}$ or alternatively $n_{J+1}$ is opened after the magnetization of elements of sensor segment $S_J$ and prior to the magnetization of elements of a sensor segment $S_{J+1}$. Intermediate steps between the magnetization steps are advantageously introduced thereby. This makes it possible that only one switch needs to be opened or closed in each step, by means of which the circuit complexity is reduced in each step. In each switching step, the occurrence of switching spikes, which may effectuate a current flow in an undesirable direction, is reduced thereby.

In one specific embodiment of the present invention, switch $p_2$ or alternatively switch $n_2$ is closed to magnetize elements of a first sensor segment $S_1$ situated at an end of the magnetizing current conductor. In all other magnetization steps, switch $p_J$ or $n_J$ has already been previously closed, i.e., in a preceding switching step. In one specific embodiment, initially one switch $n_1$ and subsequently all switches $p_{X>2}$ or alternatively initially one switch $p_1$ and subsequently all switches $n_{X>2}$ are closed prior to the magnetization of elements of first sensor segment $S_1$. In one specific embodiment, initially switch $n_N$ and subsequently switch $p_{N+1}$ or alternatively initially switch $p_N$ and subsequently switch $n_{N+1}$ are opened after the magnetization of elements of a final sensor segment $S_N$. This procedure advantageously makes it possible to activate and deactivate the magnetizing device particularly smoothly, i.e. a number of switching operations is also reduced at the beginning of the method and at the end of the method.

In one specific embodiment of the present invention, ferromagnetic layers of the magnetic field sensors of the magnetic field sensor array are magnetized, which are provided as free layers. In one specific embodiment of the present invention, the magnetic field sensors are designed as TMR sensors or as GMR sensors.

In accordance with an example embodiment of the present invention, a system for magnetizing elements of a magnetic field sensor array includes a magnetic field sensor array and a magnetizing device. The magnetic field sensor array includes a plurality of sensor segments. Each sensor segment includes a plurality of magnetic field sensors. The magnetizing device includes a magnetizing current conductor. The magnetizing current conductor is situated so as to run in the area of the magnetic field sensors in such a way that elements of the magnetic field sensors may be magnetized. A plurality of parallel-connected half-bridges of the magnetizing device, each including a high switch $p_J$ and a low switch $n_J$, each include a center tap connection situated between the switches. The magnetizing current conductor is connected to each center tap connection, by means of which the magnetizing current conductor is divided into separately controllable magnetizing segments. Each magnetizing segment is provided to magnetize elements of magnetizing field sensors of one sensor segment in each case. The magnetizing device includes two additional switches $p_{AUX}$ and $n_{AUX}$. Additional switches $p_{AUX}$ and $n_{AUX}$ are situated at opposite ends of the magnetizing current conductor and are connected in parallel to switches $p_J$ and $n_J$ having the same electrical potential. Additional switches $p_{AUX}$ and $n_{AUX}$ are provided to be always closed during the magnetization of elements of the magnetic field sensor array. The additional switches make it possible for an electrical current along the magnetizing current conductor to always take place in the desired direction.

The features and advantages of the present invention described above are made clearer and more understandable in connection with the following description of the exemplary embodiments, which are explained in greater detail in connection with the figures.

BRIEF DESCRIPTION OF THE DRAWINGS

FIG. 5 shows electrical currents of consecutive magnetizing segments during the magnetization of elements of the magnetic field sensor array according to the circuit diagram in FIG. 4.

FIG. 6 shows a method for magnetizing elements of the magnetic field sensors of the magnetic field sensor array in accordance with an example embodiment of the present invention.

FIG. 7 shows electrical currents of consecutive magnetizing segments during the magnetization of elements of the magnetic field sensor array according to the circuit diagram in FIG. 6.

DETAILED DESCRIPTION OF EXAMPLE EMBODIMENTS

Figure 1:
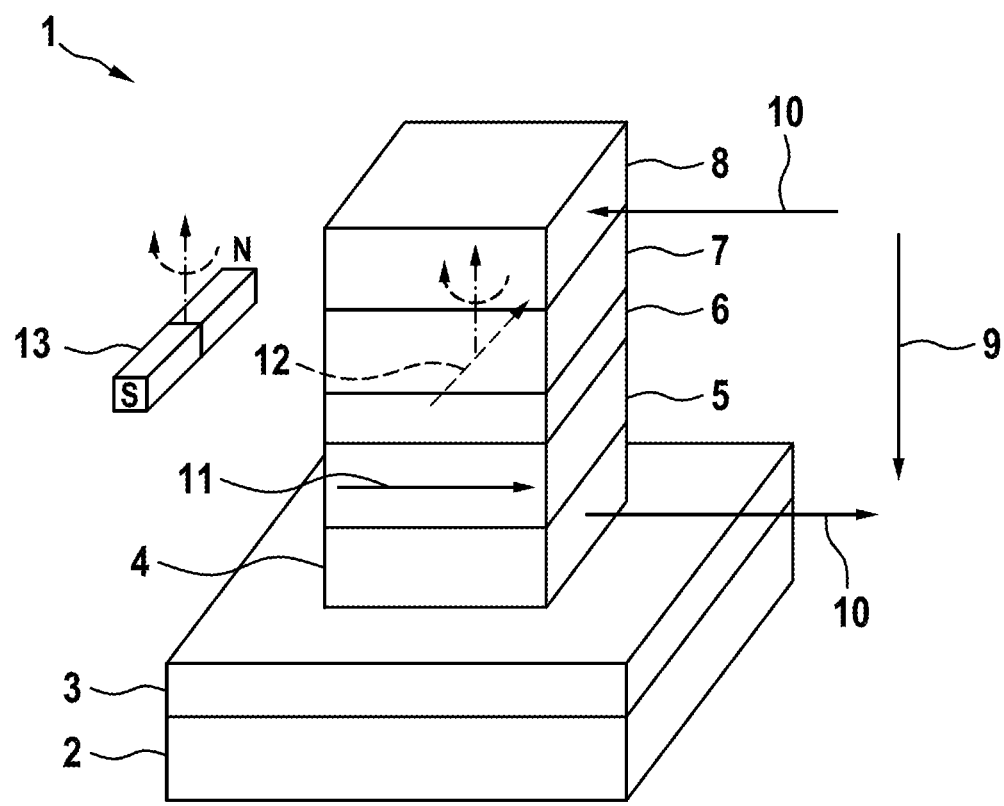
FIG. 1 shows a magnetic field sensor in a perspective view.

FIG. 1 schematically shows a magnetic field sensor 1 in a perspective view. Magnetic field sensor 1 is based by way of example on the principle of tunnel magnetoresistance (TMR). Magnetic field sensor 1 may therefore also be referred to as TMR sensor 1.

Magnetic field sensor 1 includes a substrate 2. Substrate 2 may include, for example, silicon. However, substrate 2 may also include a different material, for example another semiconductor and/or a semiconductor oxide. Magnetic field sensor 1 further includes an integrated circuit 3 (IC), which is situated on substrate 2. Integrated circuit 3 may be provided, for example, to activate magnetic field sensor 1.

A lower contact element 4 is situated above substrate 2, which is provided with an electrically conductive design. A lower ferromagnetic layer 5 is situated on lower electrical contact element 4. Lower ferromagnetic layer 5 may include, for example, a ferromagnetic alloy, for example a CoFeB alloy, or another ferromagnetic material. Additional layers may also be situated between lower contact element 4 and lower ferromagnetic layer 5. For example, an antiferromagnetic layer may also be provided.

The antiferromagnetic layer may be provided, for example, to predefine a magnetization within lower ferromagnetic layer 5. The antiferromagnetic layer may include, for example, a PtMn alloy or an IrMn alloy. Moreover, additional layers may be provided as separating layers, which may include, for example, tantalum (Ta) and/or ruthenium (Ru).

An insulation layer 6 is situated on lower ferromagnetic layer 5. Insulation layer 6 may include, for example, manganese oxide (MgO) or, for example, aluminum oxide ($Al_2O_3$) or another electrically insulating material. An upper ferromagnetic layer 7 is situated on insulation layer 6, which may also include, for example, a CoFeB alloy. An upper electrical contact element 8 is situated on upper ferromagnetic layer 7. Additional layers may also be situated between upper ferromagnetic layer 7 and upper contact element 8, for example a separating layer and/or other appropriate layers.

If an electrical voltage 9 is applied between lower contact element 4 and upper contact element 8, an electrical tunnel current 10 may flow, which overcomes insulation layer 6. A tunnel resistance depends on a magnetization of lower ferromagnetic layer 5 and a magnetization of upper ferromagnetic layer 7. More specifically, the tunnel resistance is proportionate to the cosine of an angle between a center magnetization direction 11 of lower ferromagnetic layer 5 and a center magnetization direction 12 of upper ferromagnetic layer 7.

Magnetization direction 11 of lower ferromagnetic layer 5 is indicated in FIG. 1 by a solid arrow. Magnetization direction 11 of lower ferromagnetic layer 5 is permanently predefined and is invariable in an external magnetic field 13 if a critical magnetic field strength of external magnetic field 13 is not exceeded. External magnetic field 13 is illustrated symbolically in FIG. 1 in the form of a bar magnet. Magnetization direction 11 of lower ferromagnetic layer 5 may be determined, for example, with the aid of the antiferromagnetic layer.

A further possibility for predefining and fixing magnetization direction 11 of lower ferromagnetic layer 5 is to heat lower ferromagnetic layer 5 while an external magnetic field 13 is being applied in a desired direction. External magnetic field 13 is switched off only when lower ferromagnetic layer 5 has been cooled. This process may also be referred to as annealing. Since magnetization direction 11 of lower ferromagnetic layer 5 is invariable in an external magnetic field 13 as long as a critical magnetic field strength is not exceeded, lower ferromagnetic layer 5 may also be referred to as pinned layer 5. If a critical magnetic field strength of external magnetic field 13 is exceeded, the magnetization of pinned layer 5 may be impaired. In such a case, a re-annealing of a magnetization may not be possible, since integrated circuit 3 could be destroyed during the course of the annealing. A critical magnetic field strength may be, for example, 40 mT for pinned layer 5.

A center magnetization direction 12 of upper ferromagnetic layer 7 is indicated in FIG. 1 by a dashed arrow. Magnetization direction 12 of upper ferromagnetic layer 7 is not pinned, compared to lower ferromagnetic layer 5, and for this reason follows an external magnetic field 13 in such a way that magnetization direction 12 of upper ferromagnetic layer 7 is oriented antiparallel to a component of external magnetic field 13 projected onto upper ferromagnetic layer 7. Upper ferromagnetic layer 7 may also be referred to as free layer 7, since its magnetization direction 12 is not pinned. Within the scope of this description, upper ferromagnetic layer 7 is also referred to as free layer 7, even if it does not yet have a preferred magnetization direction 12.

If the center magnetization directions of lower ferromagnetic layer 5 and upper ferromagnetic layer 7 are oriented in parallel, the tunnel resistance has a minimum. If the center magnetization directions of lower ferromagnetic layer 5 and upper ferromagnetic layer 7 are oriented anti-parallel, the tunnel resistance has a maximum. Magnetic field sensor 1 thus makes it possible to detect a magnetic field direction of an external magnetic field 13.

Magnetic field sensor 1 according to FIG. 1 is designed by way of example as a TMR sensor. Alternatively, magnetic field sensor 1 may also be designed as a GMR sensor (giant magnetoresistance, GMR). In this case, ferromagnetic layers 5, 7 are contacted by contact elements 4 and 8 on the side, so that a horizontal electrical current flow may take place in relation to substrate 2, while in the case of the TMR sensor, electrical tunnel current 10 takes place in the vertical direction in relation to substrate 2. Furthermore, a GMR sensor instead of an electrically insulating insulation layer 6 includes a non-magnetic insulation layer 6, which may include, for example, copper. However, lower ferromagnetic layer 5, insulation layer 6 and upper ferromagnetic layer 7 are situated vertically one above the other on substrate 2, as in the case of TMR sensor 1.

An externally applied magnetic field 13, which exceeds a critical magnetic field strength in relation to the magnetization of free layer 7, which may be, for example, 3,000 µT, results in center magnetization direction 12 of free layer 7 being impaired. This is referred to as a sustained misorientation of free layer 7. A misorientation may result in that magnetic field sensor 1 has an undesirable change of a zero field error, i.e., a change of an offset between magnetization direction 11 of pinned layer 5 and magnetization direction 12 of free layer 7. Moreover, a misorientation of free layer 7 may result in an undesirable change of a gain, i.e., a quotient of a change of the tunnel resistance and a change of external magnetic field 13.

A misorientation of magnetization direction 12 of free layer 7 may be compensated for in that a sufficiently strong external magnetic field 13 is generated at the location of free layer 7, which restores a desired center magnetization direction 12 of free layer 7. This is achieved by a magnetizing current conductor, which is situated so as to run on the area of magnetic field sensor 1 in such a way that free layer 7 of magnetic field sensor 1 may be magnetized with the aid of the magnetizing current conductor. A misalignment or a misorientation may be corrected or reset thereby. An electrical current of 30 mA, for example, may be applied to the magnetizing current conductor, by means of which a magnetic field strength at the location of free layer 7 may be, for example, 15 mT. It may be sufficient if the application to the magnetizing current conductor takes place for a period of some 10 ns to restore the magnetization of free layer 7. This generation or resetting of the magnetization of free layer 7 may also be referred to as a "bit reset."

Figure 2:
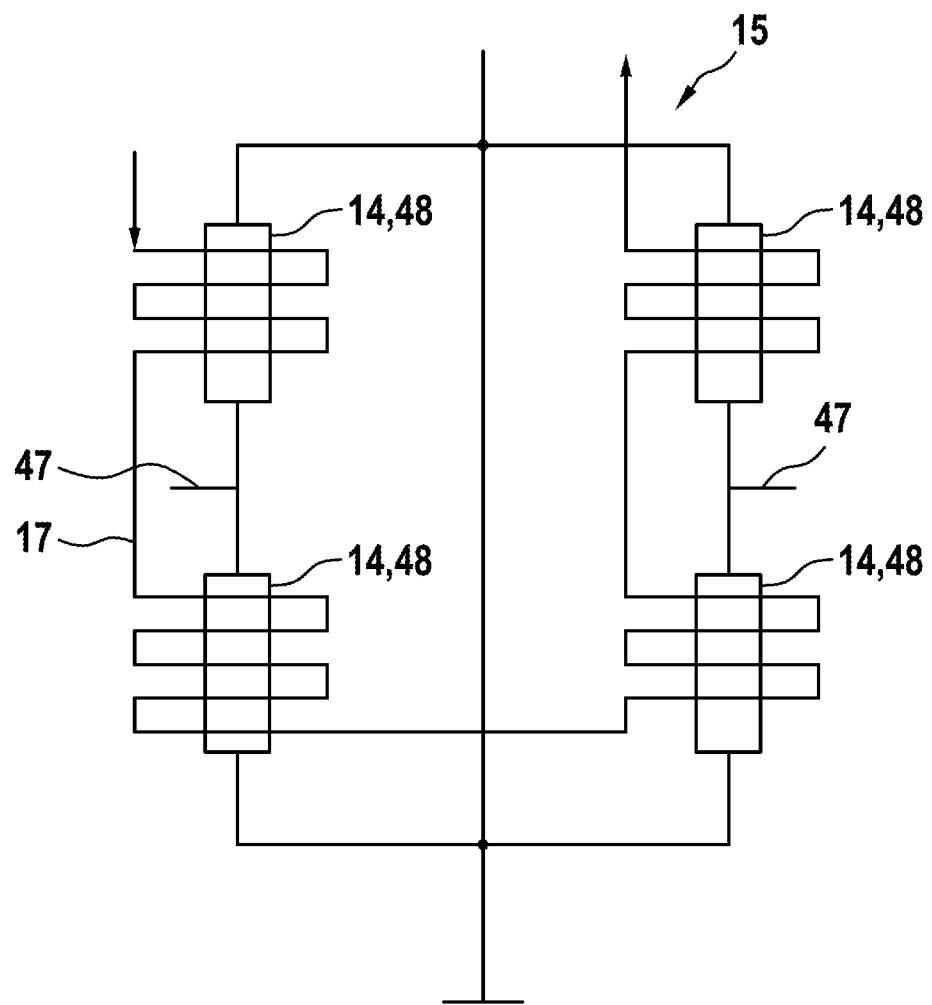
FIG. 2 shows a magnetic field sensor array, including a magnetizing device and a profile of a magnetizing current conductor of the magnetizing device.

Not only an upper ferromagnetic layer 7 of a single magnetic field sensor 1 is frequently suitably magnetized within the scope of the "bit reset" but also a plurality of free layers 7 of a plurality of magnetic field sensors 1 of a magnetic field sensor array 14. FIG. 2 schematically shows an example of a circuit, including a magnetic field sensor array 14 and a magnetizing device 15 for magnetizing free layers 7 of magnetic field sensors 1. Magnetizing device 15 may be, for example, part of integrated circuit 3.

Magnetic field sensor array 14 includes four resistor segments 48. Each resistor segment 48 includes a plurality of magnetic field sensors 1. For example, one resistor segment 48 may include several hundred magnetic field sensors 1. These may be TMR sensors 1 or GMR sensors 1. For the sake of clarity, magnetic field sensors 1 of resistor segments 48 are not illustrated in FIG. 2. Magnetic field sensors 1 of each resistor segment 48 form an electrical resistance, due to their particular tunnel resistance. The electrical resistances of resistor segments 48 may suitably be of the same size. However, this is not absolutely necessary. The four resistor segments 48 are electrically connected to each other in such a way that they form a Wheatstone bridge circuit. Two signal output lines 47, each of which is situated between two series-connected resistor segments 48, make it possible to ascertain a total signal of magnetic field sensor array 14, in that a difference signal is ascertained from signals present at the two signal output lines 47.

Magnetizing device 15 includes a magnetizing current conductor 17. Magnetizing current conductor 17 is situated so as to run in the area of magnetic field sensors 1 in such a way that elements of magnetic field sensors 1 may be magnetized. Magnetizing current conductor 17 may be suitably situated along all magnetic field sensors 1. A magnetizing current would ideally also flow simultaneously along all magnetic field sensors 1. However, this is not possible, due to a relatively high electrical resistance of magnetizing current conductor 17, a finite operating voltage and a high magnetizing current, so that a segmentation of magnetic field sensors 1 into resistor segments 48 and sensor segments 16 is necessary. The segmentation into sensor segments 16 is explained within the scope of the description of FIG. 3. The segmentation into resistor segments 48 is only optional and not absolutely necessary.

Magnetizing current conductor 17 may be provided, for example, to magnetize free layers 7 of magnetic field sensors 1 of magnetic field sensor array 14 in each case. Magnetizing current conductor 17 may alternatively also be used to magnetize lower ferromagnetic layers 5 or pinned layers 5 of magnetic field sensors 1. For this purpose, magnetizing current conductor 17 may be situated in the area of lower ferromagnetic layers 5 in such a way that lower ferromagnetic layers 5 may be magnetized. In the following description, only the magnetization of upper ferromagnetic layers 7 is explained as an example, which are provided as free layers 7. However, the following description may also be similarly transferred to the magnetization of lower ferromagnetic layers 5 or pinned layers 5.

Figure 3:
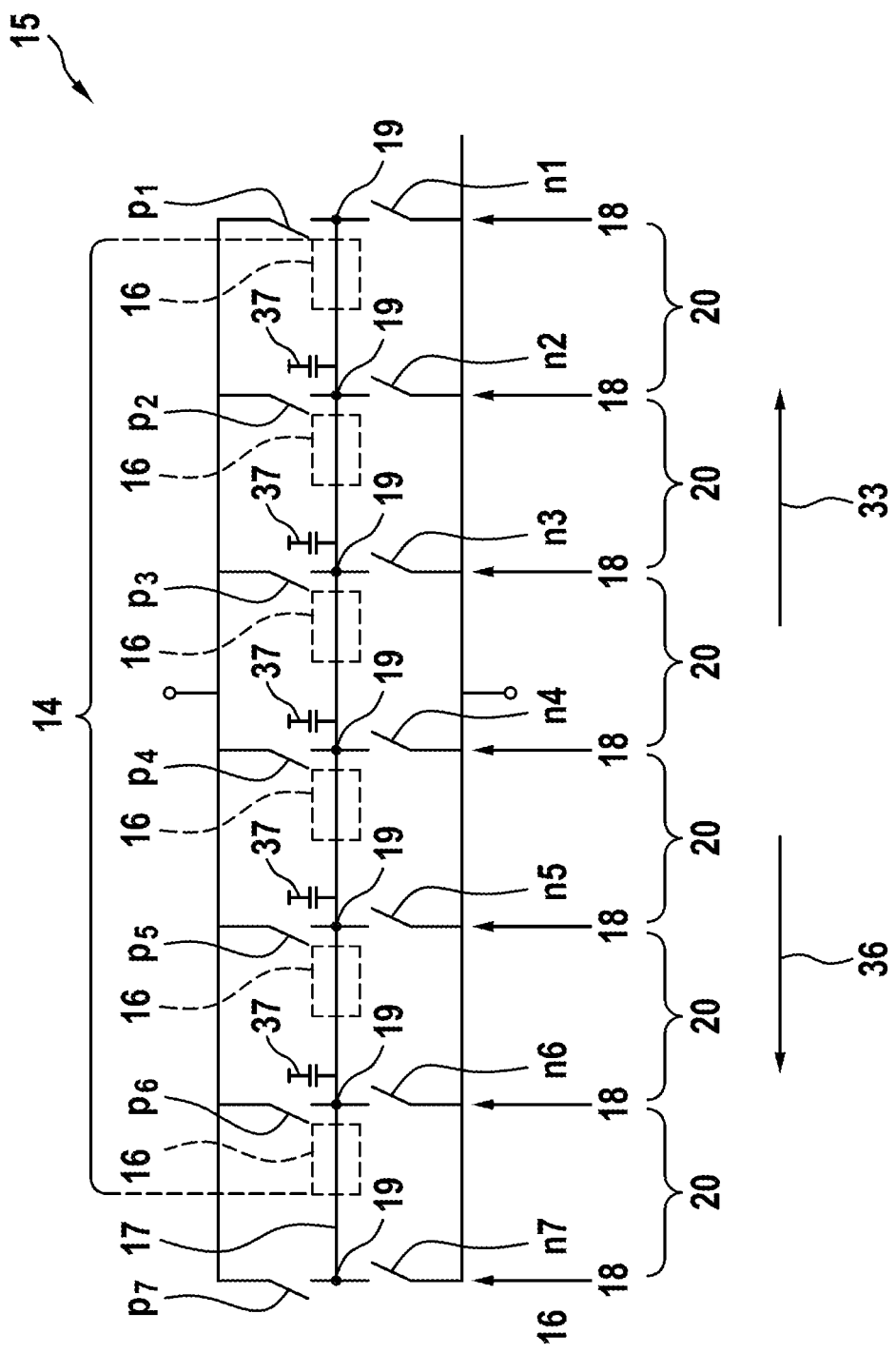
FIG. 3 shows further elements of the magnetic sensor array and the magnetizing device.

FIG. 3 shows further elements of magnetic sensor array 14 and magnetizing device 15 from FIG. 2. Magnetic field sensor array 14 includes a plurality of sensor segments 16. For example, the magnetic field sensor array from FIG. 2 includes a total of six sensor segments 16. However, the number of sensor segments 16 may be arbitrary. Each sensor segment 16 includes a plurality of magnetic field sensors 1. For example, one sensor segment 16 may include several hundred magnetic field sensors 1. These may be TMR sensors 1 or GMR sensors 1. For the sake of clarity, magnetic field sensors 1 of sensor segments 16 are not illustrated in FIG. 3. The number of sensor segments 16 does not necessarily have to correspond to the number of resistor segments 48. An arbitrary number of sensor segments 16 may be grouped into four resistor segments 48. The number of sensor segments 16 may suitably be divided by four to be able to implement four resistor segments 48 of the same size as a Wheatstone bridge circuit. For example, magnetic field sensors 1 of sensor segments 16 may be arranged in each case on a separate substrate 2 or on a shared substrate 2. A separate substrate 2 for arbitrary subsets of sensor segments 16 may also be provided in each case. Correspondingly, magnetizing device 15 may be implemented on a plurality of substrates 2 and as part of a plurality of integrated circuits 3.

Magnetizing device 15 includes a plurality of parallel-connected half-bridges 18, each including a high switch $p_J$ and a low switch $n_J$ and each including a center tap connection 19 situated between switches $p_J$ and $n_J$. The switches may be designed, for example, as MOSFETs (metal-oxide semiconductor field-effect transistors). Magnetizing current conductor 17 is connected to each center tap connection 19, by means of which magnetizing current conductor 17 is divided into separately controllable magnetizing segments 20. Each magnetizing segment 20 is provided for the purpose of magnetizing elements of magnetizing field sensors 1 of one sensor segment 16 in each case. Since six sensor segments 16 are present in the specific embodiment, it is advantageous that magnetizing device 15 includes a total of six magnetizing segments 20. For this reason, magnetizing device 15 in the illustrated specific embodiment includes seven half-bridges 18, i.e., seven high switches $p_J$ and seven low switches $n_J$. Switches $p_J$, $n_J$ may be designed so as to be freely controllable with the aid of a control unit, which is not illustrated in FIG. 3. A free control is characterized in that a series of switching operations may be arbitrarily selected. By applying an electrical voltage to half-bridges 18 and using an advantageous circuit diagram, individual sensor segments 16 may be magnetized in this way. The applied electrical voltage may be in a range of, for example, 2V to 3V, but is not limited hereto. In principle, value indications or value range indications within the scope of this description are not to be understood as limiting but instead as an indication of a suitable magnitude, which permits those skilled in the art to carry out the present invention.

Figure 4:
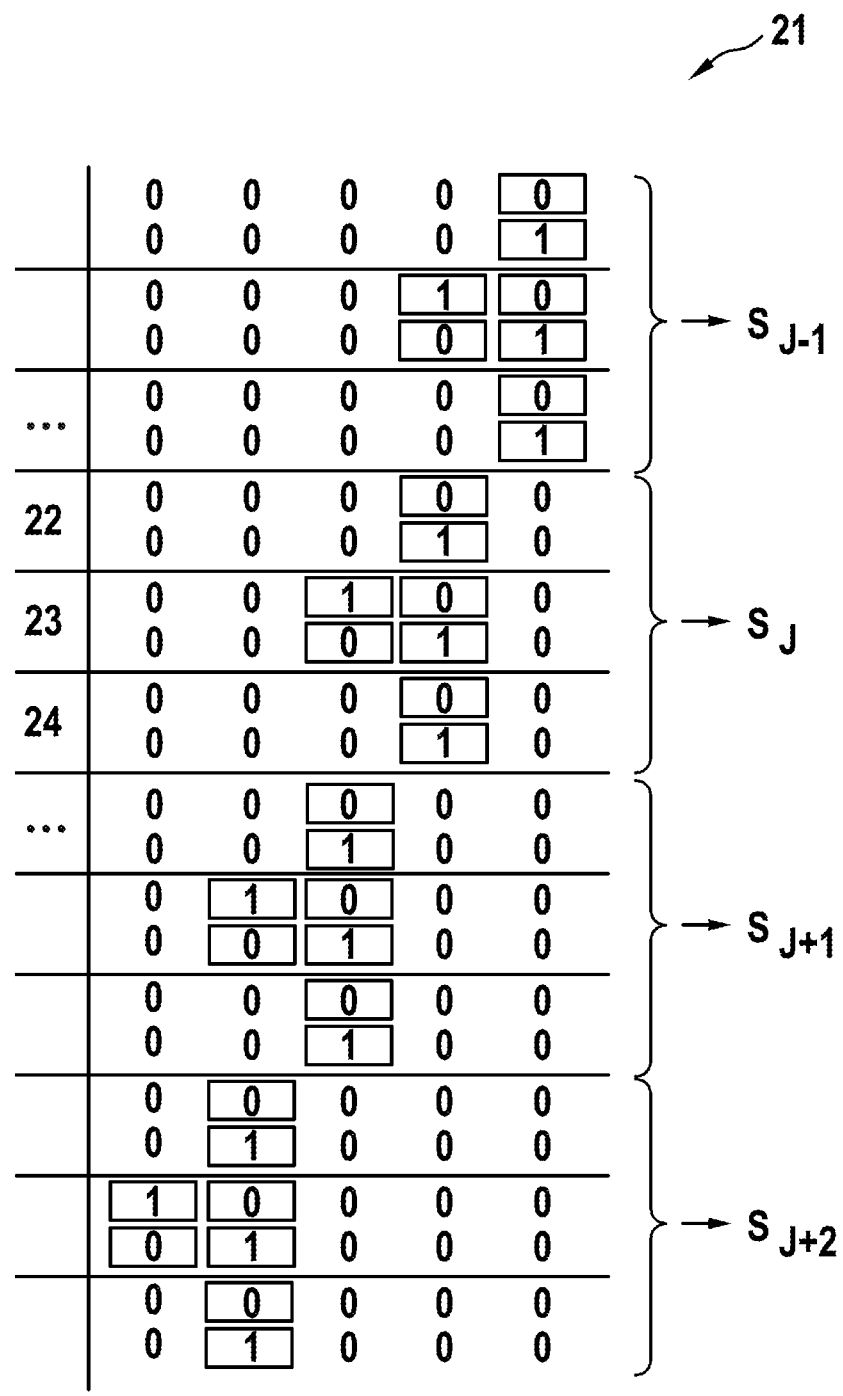
FIG. 4 shows a conventional method for magnetizing elements of the magnetic field sensor array.

FIG. 4 shows a circuit diagram 21 of a method for magnetizing elements of magnetic field sensor array 14 with the aid of magnetizing device 15. Circuit diagram 21 shows only the magnetization of elements of four sensor segments 16 as an example. Elements of each sensor segment 16 may, however, be magnetized in the identical manner. For this reason, only steps 22, 23, 24 are explained, within the scope of which elements of an individual but arbitrary sensor segment $S_J$ are magnetized. If a switch is opened, i.e., in a non-conductive state, this is indicated by a "0" in FIG. 4. However, if a switch is closed, i.e., in a conductive state, this is indicated by a "1" in FIG. 4.

After the application of the electrical voltage to magnetizing device 15, elements of sensor segment $S_J$ are magnetized according to the following procedure. In a first step 22, a switch $n_J$ is initially closed. Since all other switches are open, no electrical current yet flows. In a second step 23, a switch $p_{J+1}$ is additionally closed. As a result, an electrical current flows through magnetizing segment $M_J$ of magnetizing current conductor 17, by means of which elements of magnetic field sensors 1 of sensor segment $S_J$ of magnetic field sensor array 14 are magnetized. In a third step 24, switch $p_{J+1}$ is reopened, so that once again no electrical current is able to flow. Steps 22, 23, 24 are now repeated for a subsequent sensor segment $S_{J+1}$. Elements of sensor segments 16 are thus magnetized sequentially.

The electrical current flow must always take place in a desired direction during the magnetization of elements of a sensor segment 16. If this is not the case, layers 5, 7 to be magnetized may be at least partially remagnetized along a preferred direction. Impairments of the magnetization may be subject to a random effect, which becomes noticeable at an output of a magnetic field sensor 1 as undesirable additional noise.

FIG. 5 shows a current diagram 25, a time being plotted on an abscissa 26 and an electrical current being plotted on an ordinate 27. Electrical currents 28, 29, 30, 31 of four consecutive magnetizing segments 20 of magnetizing current conductor 17 are shown during the magnetization of elements of magnetic field sensor array 14.

A total of four consecutive current pulses 32 are shown. Current pulses 32 occur when elements of four consecutive sensor segments 16 are magnetized. Current pulses 32 may take place for a period of, for example, 10 ns and have an amplitude of, for example, 30 mA. Current pulses 32 take place in such a way that a current flow always takes place in the desired direction 33, which is shown in FIG. 3. However, the polarity of magnetizing device 15 may also be reversed, so that current pulses 32 would take place in the opposite direction.

In addition to desired current pulses 32, additional pulses 34 also occur. Additional pulses 34 occur in a magnetizing segment $M_J$ of magnetizing current conductor 17 when another magnetizing segment 20 is magnetized. Additional pulse 34 in a magnetizing segment $M_J$ has a high amplitude, in particular, when an electrical current is applied to an adjacent and subsequent magnetizing segment $M_{J+}$ for the purpose of magnetizing elements of sensor segment $S_{J+1}$. In the area of rising edges 35 of current pulses 32, additional pulses 34 are negative, i.e., they take place along an inverse direction 36, which is also illustrated in FIG. 3. This may result in a remagnetization of elements to be magnetized of magnetic field sensors 1. The additional current flow along inverse direction 36 takes place due to an electrical coupling of magnetizing segments 20 of magnetizing current conductor 17. The necessity for an electrical coupling of magnetizing segments 20 results from a scarcity of space. To overcome the electrical coupling, each magnetizing segment 20 would have to include its own half-bridge 18. Two adjacent magnetizing segments 20 would thus not include a shared half-bridge 18. However, this would require a significantly larger number of switches. For this reason, magnetizing segments 20 are provided with an electrically coupled design. However, this results in the fact that parasitic capacitances 37 are effective in the area of each magnetizing segment 20. These effectuate the inverse current flow. A disadvantage of the method or circuit diagram 21 shown in FIG. 4 is that an inverse current flow may take place in adjacent magnetizing segments 20 within the scope of a second step 23, in which elements of a sensor segment 16 are magnetized.

Example embodiments of the present invention are based on overcoming this disadvantage. FIG. 6 shows a method 38 for magnetizing elements of magnetic field sensors 1 of magnetic field sensor array 14 from FIG. 3 with the aid of magnetizing device 15. Method 38 is carried out according to a circuit diagram 39, which includes instructions for switching steps 101 through 115, within the scope of which switches $p_J$ and $n_J$ of magnetizing device 15 are switched after an electrical voltage has been applied to magnetizing device 15 for the purpose of magnetizing elements of individual sensor segments 16.

Elements of a sensor segment $S_J$ are magnetized in that two switches $n_J$ and $p_{J+1}$ having different electrical potentials, or alternatively $p_J$ and $n_{J+1}$, of two directly adjacent half-bridges 18 are closed simultaneously. As a result, an electrical current is applied to a corresponding magnetizing segment $M_J$, by means of which elements of magnetic field sensors 1 of sensor segment $S_J$ are magnetized. This is the case in FIG. 6 after a third switching step 103, a fifth switching step 105, a seventh switching step 107, a ninth switching step 109, an eleventh switching step 111 and a thirteenth switching step 113. Moreover, at least one further switch $n_{X<J}$ or $p_{Y>J+1}$ or alternatively $p_{X<J}$ or $n_{Y>J+1}$ is closed. In the exemplary specific embodiment in FIG. 6, all further switches $n_{X<J}$ or $p_{Y>J+1}$ are closed in third switching step 103, in fifth switching step 105, in seventh switching step 107, in ninth switching step 109, in eleventh switching step 111 and in thirteenth switching step 113. However, this is not necessary. It is sufficient if one of further switches $n_{X<J}$ or $p_{Y>J+1}$ is closed. The closing of at least one further switch $n_{X<J}$ or $p_{Y>J+1}$ results in the fact that no electrical current may flow along inverse direction 36 between a magnetizing segment $M_J$, to which an electrical current is applied for the purpose of magnetizing elements of sensor segment $S_J$, and further switch $n_{X<J}$ or $p_{Y>J+1}$ along magnetizing current conductor 17. If all further switches $n_{X<J}$ or $p_{Y>J+1}$ are closed, as in the exemplary specific embodiment, an inverse current may not flow in any of magnetizing segments $M_{X\ne J}$. As a result, all other sensor segments $S_{X\ne J}$ are protected against inverse flows and thus misoriented magnetic fields. Since the inverse current flow, occurs, in particular, in a directly adjacent magnetizing segment $M_{J-1}$, to which an electrical current was previously applied (see FIG. 5), it may be advantageous if only switch $n_{J-1}$ is additionally closed as the further switch for the purpose of effectively protecting all magnetic field sensors 1 of magnetic field sensor array 14.

Only as an example, FIG. 6 shows that elements of consecutive sensor segments 16 are magnetized sequentially along magnetizing current conductor 17, starting with a sensor segment 16 situated at an outermost end of magnetizing current conductor 17. However, this is not absolutely necessary. A sequence, in which electrical current is applied to magnetizing segments 20, may also be arbitrary. However, the sequential magnetization offers the advantage that a number of switching operations may be reduced. The number of switching operations may be reduced, in particular, if consecutive sensor segments 16 are magnetized sequentially along magnetizing current conductor 17 and, in addition, all further switches $n_{X<J}$ or $p_{Y>J+1}$, or alternatively $p_{X<J}$ or $n_{Y>J+1}$, are closed in a corresponding switching step 103, 105, 107, 109, 111, 113.

After the magnetization of elements of sensor segment $S_J$ and prior to the magnetization of elements of sensor segment $S_{J+1}$, switch $p_{J+1}$ or alternatively switch $n_{J+1}$ may be opened within the scope of an optional additional switching step 104, 106, 108, 110, 112. At least one further switch $n_{X<J}$ or $p_{Y>J+1}$ or alternatively $p_{X<J}$ or $n_{Y>J+1}$ is also closed to prevent an inverse current flow at least in one magnetizing segment 20. Additional switching steps 104, 106, 108, 110, 112 may also be omitted, but they offer the advantage that only one switching operation has to be carried out between each switching step 103 through 113, i.e., only one switch must be opened or closed, which makes it possible to reduce switching spikes.

To magnetize elements of a first sensor segment $S_1$ situated at an end of magnetizing current conductor 17, switch $p_2$ or alternatively switch $n_2$ may be closed within the scope of third switching step 103, i.e. this switch is opened after a second switching step 102. Prior to magnetizing elements of first sensor segment $S_1$, initially one switch $n_1$ and subsequently all switches $p_{X>2}$ or alternatively initially one switch $p_1$ is closed within the scope of a first switching step 101 and subsequently all switches $n_{X>2}$ may be closed within the scope of a second switching step 102. As a result, a state after second switching step 102 is identical to a state after fourth switching step 104. However, it may be sufficient if at least one of switches $p_{X>2}$ or alternatively one of switches $n_{X>2}$ is closed after second switching step 102. First switching step 101 and second switching step 102 may also be exchanged with each other. On the whole, first and second switching steps 101, 102 offer the advantage that magnetizing device 15 may be particularly smoothly switched on with regard to inverse current flows. However, first switching step 101 and second switching step 102 may also be omitted.

After magnetizing elements of a final sensor segment $S_N$, N=6 in the exemplary specific embodiment, switch $n_N$ may be opened within the scope of a fourteenth switching step 114 and switch $p_{N+1}$ may be subsequently opened within the scope of a fifteenth switching step 115, or alternatively initially switch $p_N$ and subsequently switch $n_{N+1}$ may be opened. As a result, a state after fourteenth switching step 114 is identical to a state after a twelfth switching step 112. Fourteenth and fifteenth switching steps 114, 115 have the advantage that magnetizing device 15 may be particularly smoothly switched off with regard to inverse currents.

Fourteenth switching step 114 and fifteenth switching step 115 may also be exchanged with each other. However, fourteenth switching step 114 and fifteenth switching step 115 may also be omitted.

FIG. 7 shows a current diagram 40, a time being plotted on an abscissa 26 and an electrical current being plotted on an ordinate 27. For example, electrical currents 41, 42, 43 of the three last magnetizing segments 20 of magnetizing current conductor 17 of magnetizing device 15 in FIG. 3 are shown during the magnetization of elements of magnetic field sensor array 14 according to method 38 in FIG. 6.

Elements of magnetic field sensors 1 of sensor segments $S_4$, $S_5$ and $S_6$ are magnetized consecutively. Sensor segment $S_6$ is magnetized after thirteenth switching step 113 according to FIG. 6. A corresponding electrical current 41 of associated magnetizing segment $M_6$ is maximal after thirteenth switching step 113. Similarly, an electrical current 42 of associated magnetizing segment $M_5$ is maximal after eleventh switching step 111, and an electrical current 43 of associated magnetizing segment $M_4$ is maximal after ninth switching step 109. The exact profile of electrical currents 41, 42, 43 may be related to Kirchhoff's laws. This will not be explained in greater detail here. FIG. 7 shows, in particular, that circuit diagram 39 in FIG. 6 results in the fact that a negative magnetizing current does not flow at any point in time. This offers the advantage that ferromagnetic layers 5, 7 of magnetic field sensors 1 to be magnetized are always magnetized in the desired direction.

Figure 8:
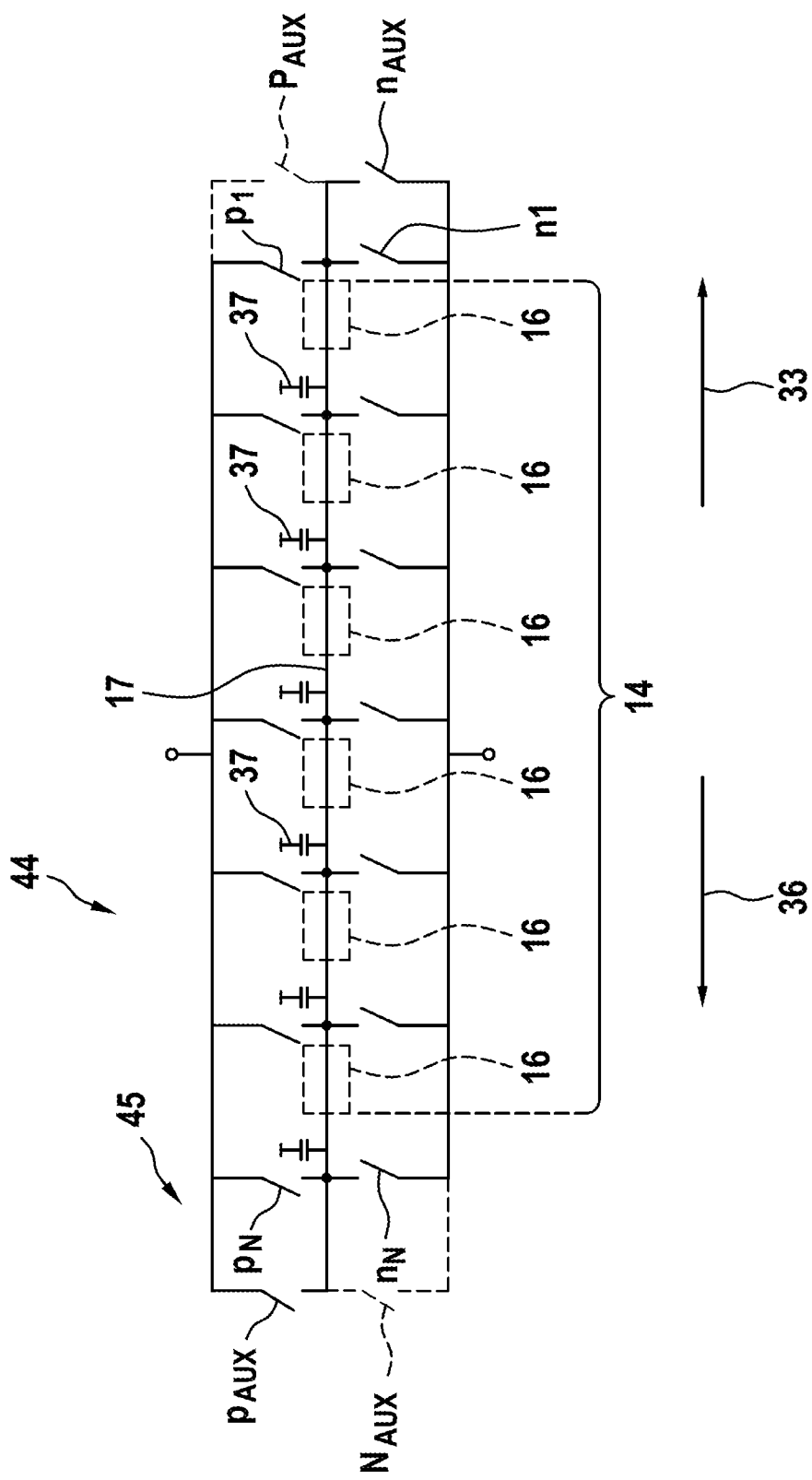
FIG. 8 shows a system for magnetizing elements of a magnetic field sensor array, including additional switches, in accordance with an example embodiment of the present invention.

One alternative to method 38 in FIG. 6 for magnetizing elements of a magnetic field sensor array 14 with the aid of magnetizing device 15 offers a system 44 for magnetizing elements of a magnetic field sensor array 14, which is illustrated in FIG. 8. System 44 includes magnetic field sensor array 14, which is provided with an identical design to magnetic field sensor array 14 in FIG. 3, and a further magnetizing device 45. Further magnetizing device 45 has great similarities with magnetizing device 15 in FIG. 3. In the following description, only differences between magnetizing devices 15, 45 are explained.

Further magnetizing device 45 includes two additional switches $p_{AUX}$ and $n_{AUX}$. Additional switches $p_{AUX}$ and $n_{AUX}$ are situated at opposite ends of magnetizing current conductor 17 and are connected in parallel to switches $p_J$ and $n_J$ having the same electrical potential. Additional switches $p_{AUX}$ and $n_{AUX}$ are provided to be always closed during the magnetization of elements of magnetic field sensor array 14. In contrast thereto, additional switches $p_{AUX}$ and $n_{AUX}$ in FIG. 8 are shown in the open state only so that they are apparent. Closed additional switches $p_{AUX}$ and $n_{AUX}$ make it possible for a current flow to always take place in desired direction 33 and never in inverse direction 36, by means of which layers 5, 7 of magnetic field sensors 1 to be magnetized may always be magnetized in the desired direction. For example, system 44 makes it possible for circuit diagram 21 from FIG. 4 or another circuit diagram to be used for the purpose of magnetization, without an inverse current being able to flow, which would impair the magnetization of a ferromagnetic layer 5, 7. An additional complexity for introducing switches $p_{AUX}$ and $n_{AUX}$ is thus compensated for by the simpler circuit diagram in FIG. 4.

To be able to carry out a "bit reset" in two opposite directions 33, 36, system 44 may include further additional switches $P_{AUX}$ and $N_{AUX}$. These are illustrated by the dashed lines in FIG. 7. Further additional switch $P_{AUX}$ forms an additional half-bridge with additional switch $n_{AUX}$. Further additional switch $N_{AUX}$ forms a further additional half-bridge with additional switch $p_{AUX}$. As a result, method 21 from FIG. 4 or method 38 from FIG. 6 may be carried out in such a way that the magnetizing current may flow in opposite directions 33, 36.

What is claimed is:

1. A method for magnetizing elements of a magnetic field sensor array using a magnetizing device, the magnetic field sensor array including a plurality of sensor segments, each of the sensor segments including a plurality of magnetic field sensors, a magnetizing current conductor of the magnetizing device being situated so as to run in an area of the magnetic field sensors in such a way that elements of the magnetic field sensors may be magnetized, the magnetizing device including a plurality of parallel-connected half-bridges, each of the half-bridges including a high switch $p_J$ and a low switch $n_J$ and each of the half bridges including a center tap connection situated between the switches $p_J$ and $n_J$, the magnetizing current conductor being connected to each of the center tap connection, by means of which the magnetizing current conductor is divided into separately activatable magnetizing segments, each of the magnetizing segments being provided to magnetize the elements of the magnetic field sensors of a respective one of the sensor segments, the method comprising the following steps:

applying an electrical voltage to the magnetizing device; and magnetizing the elements of individual sensor segments of the plurality of sensor segments, the elements of each sensor segment $S_J$ being magnetized in that two switches $n_J$ and $p_{J+1}$ having different electrical potentials, or alternatively $p_J$ and $n_{J+1}$, of two directly adjacent half-bridges are closed simultaneously, by means of which an electrical current is applied to a corresponding magnetizing segment $M_J$, wherein at least one further switch $n_{X<J}$ or $p_{Y>J+1}$ or alternatively $p_{X<J}$ or $n_{Y>J+1}$ is closed, wherein all further switches $n_{X<J}$ and $p_{Y>J+1}$ or alternatively $p_{X<J}$ and $n_{Y>J+1}$ are simultaneously closed while elements of the sensor segment $S_J$ are being magnetized.

2. A method for magnetizing elements of a magnetic field sensor array using a magnetizing device, the magnetic field sensor array including a plurality of sensor segments, each of the sensor segments including a plurality of magnetic field sensors, a magnetizing current conductor of the magnetizing device being situated so as to run in an area of the magnetic field sensors in such a way that elements of the magnetic field sensors may be magnetized, the magnetizing device including a plurality of parallel-connected half-bridges, each of the half-bridges including a high switch $p_J$ and a low switch $n_J$ and each of the half bridges including a center tap connection situated between the switches $p_J$ and $n_J$ the magnetizing current conductor being connected to each of the center tap connection, by means of which the magnetizing current conductor is divided into separately activatable magnetizing segments, each of the magnetizing segments being provided to magnetize the elements of the magnetic field sensors of a respective one of the sensor segments, the method comprising the following steps:

applying an electrical voltage to the magnetizing device; and magnetizing the elements of individual sensor segments of the plurality of sensor segments, the elements of each sensor segment $S_J$ being magnetized in that two switches $n_J$ and $p_{J+1}$ having different electrical potentials, or alternatively $p_J$ and $n_{J+1}$, of two directly adjacent half-bridges are closed simultaneously, by means of which an electrical current is applied to a corresponding magnetizing segment $M_J$, wherein at least one further switch $n_{X<J}$ or $p_{Y>J+1}$ or alternatively $p_{X<J}$ or $n_{Y>J+1}$ is closed, wherein elements of consecutive sensor segments of the plurality of sensor elements are magnetized sequentially along the magnetizing current conductor, starting with a first sensor segment situated at an outermost end of the magnetizing current conductor.

3. The method as recited in claim 2, wherein the switch $p_{J+1}$ or alternatively $n_{J+1}$ is opened after the magnetization of the elements of the sensor segment $S_J$ and prior to the magnetization of the elements of a next sensor segment $S_{J+1}$.

4. The method as recited in claim 2, wherein the switch $p_2$ or alternatively the switch $n_2$ is closed to magnetize elements of a first sensor segment $S_1$ of the plurality of sensor segments situated at an end of the magnetizing current conductor.

5. The method as recited in claim 4, wherein initially one switch $n_1$ and subsequently all switches $p_{X>2}$ or alternatively initially one switch $p_1$ and subsequently all switches $n_{X>2}$ are closed before the magnetization of the elements of the first sensor segment $S_1$.

6. The method as recited in claim 2, wherein initially the switch $n_N$ and subsequently the switch $p_{N+1}$ or alternatively initially the switch $p_N$ and subsequently the switch $n_{N+1}$ are opened after the magnetization of the elements of a final sensor segment $S_N$ of the plurality of sensor elements.

7. The method as recited in claim 1, wherein ferromagnetic layers of the magnetic field sensors of the magnetic field sensor array are magnetized, which are provided as free layers.

8. The method as recited in claim 1, wherein the magnetic field sensors are tunnel magnetoresistance (TMR) sensors or giant magnetoresistance (GMR) sensors.

9. A system for magnetizing elements of a magnetic field sensor array, comprising:
   a magnetic field sensor array; and
   a magnetizing device;
   wherein the magnetic field sensor array includes a plurality of sensor segments, each of the sensor segments including a plurality of magnetic field sensors;
   wherein the magnetizing device includes a magnetizing current conductor, the magnetizing current conductor being situated so as to run in an area of the magnetic field sensors in such a way that elements of the magnetic field sensors may be magnetized;
   wherein the magnetizing device includes a plurality of parallel-connected half-bridges, each of the half-bridges including a high switch $p_J$ and a low switch $n_J$, and each of the half-bridges including a center tap connection situated between the switches $p_J$ and $n_J$, the magnetizing current conductor being connected to each of the center tap connections, by means of which the magnetizing current conductor is divided into separately activatable magnetizing segments, each of the magnetizing segments being provided to magnetize the elements of the magnetizing field sensors of a respective one of the sensor segments; and
   wherein the magnetizing device includes two additional switches $p_{AUX}$ and $n_{AUX}$, the additional switches $p_{AUX}$ and $n_{AUX}$ being situated at opposite ends of the magnetizing current conductor and being connected in parallel to switches $p_J$ and $n_J$ having the same electrical potential, the additional switches $p_{AUX}$ and $n_{AUX}$ being provided to be always closed during the magnetization of elements of the magnetic field sensor array.

* * * * *